United States Patent [19]
Adams et al.

[11] Patent Number: 6,061,381
[45] Date of Patent: May 9, 2000

[54] OPTICALLY RESONANT STRUCTURE

[75] Inventors: Michael John Adams, Woodbridge; Michael Andreja Fisher, Ipswich, both of United Kingdom

[73] Assignee: British Telecommunications public limited company, London, United Kingdom

[21] Appl. No.: 09/043,768

[22] PCT Filed: Sep. 26, 1996

[86] PCT No.: PCT/GB96/02375

§ 371 Date: May 5, 1998

§ 102(e) Date: May 5, 1998

[87] PCT Pub. No.: WO97/13302

PCT Pub. Date: Apr. 10, 1997

[30] Foreign Application Priority Data

Sep. 29, 1995 [EP]  European Pat. Off. .............. 95306917

[51] Int. Cl.⁷ ............................... H01S 3/08; H01S 3/19
[52] U.S. Cl. ............................................. 372/96; 372/46
[58] Field of Search ................................ 372/96, 92, 46, 372/102, 19, 99, 50

[56] References Cited

U.S. PATENT DOCUMENTS

| | | | |
|---|---|---|---|
| 5,301,201 | 4/1994 | Dutta et al. ................................. | 372/43 |
| 5,357,591 | 10/1994 | Jiang et al. ................................ | 385/37 |
| 5,388,120 | 2/1995 | Ackley et al. ............................. | 372/99 |
| 5,555,255 | 9/1996 | Kock et al. ................................ | 372/96 |
| 5,568,504 | 10/1996 | Kock et al. ................................ | 372/96 |

FOREIGN PATENT DOCUMENTS 0 614 255  9/1994  European Pat. Off. .

OTHER PUBLICATIONS

Applied Physics Letters., vol. 66, No. 21, May 22, 1995, New York US, pp. 2769–2771, XP002020776 J.–H.Ser et al.: "Polarization Stabilization of Vertical–Cavity Top–Surface–Emitting Lasers by Inscription of Fine Metal–Interlaced Gratings" see whole document.

IEEE Photonics Technology Letters, vol. 6, No. 8, Aug. 1994, New York US, pp. 924–926, XP002020777 Y.A. Wu et al.: "Transverse Mode Selection with a Passive Antiguide Region in Vertical Cavity Surface Emitting Lasers" see whole document.

Applied Physics Letter., vol. 65, No. 2, Jul. 11, 1994, New Yrok US, pp. 144–146, XP002020778 D. Vakhshoori et al.: "Zone Lasers" cited in the application see whole document.

Applied Physics Letters., vol. 60, No. 16, Apr. 20, 1992, New York US, pp. 1921–1923, XP002020779 T. Erdogan et al.: "Circularly Symmetric Operation of a Concentric–Circle–Grating, Surface–Emitting, ALGaAx/GaAs Quantum––Well Semiconductor Laser" cited in the application see whole document.

Japanese Journal of Applied Physics., vol. 32, Part 2, No. 11A, Nov. 1, 1993, Tokyo JP, pp. L1612–L1614, XP002020780 Y. Kaneko et al.: "Transverse–Mode Characteristics of InGaAs/GaAs Vertical–Cavity Surface–Emitting Lasers Considering Gain Offset" see whole document.

Applied Physics Letters., vol. 58, No. 8, Feb. 25, 1991, New York US, pp. 804–806, XP002020781 M. Orenstein et al.: "Two–Dimensional Phase–Locked Arrays of Vertical–Cavity Semiconductor Lasers by Mirror Reflectivity Modulation" see whole document.

*Primary Examiner*—James W. Davie
*Assistant Examiner*—Quyen P. Leung
*Attorney, Agent, or Firm*—Nixon & Vanderhye P.C.

[57] ABSTRACT

A vertical cavity surface emitting laser includes a resonant cavity formed between a distributed Bragg reflector formed of semiconductor material and an overlying distributed Bragg reflector formed of dielectric material The resonant cavity contains a layer of laser active material sandwiched between spacer layers and a blocking layer which confines an energizing electric current to flow through the cavity between a metallic contact layer on the underside of the Bragg reflector and a contract. In order to support a preselected resonant mode, a series of concentric rings is formed in the blocking layer surrounding the resonant cavity so as to provide a Bragg structure which reflects light from the cavity with a phase characteristic that supports the preselected transverse resonant mode.

23 Claims, 3 Drawing Sheets

OPTICALLY RESONANT STRUCTURE

BACKGROUND OF THE INVENTION

1. Field of the Invention

This invention relates to an optically resonant structure and has particular but not exclusive application to a vertical cavity surface emitting laser (VCSEL).

2. Related Art

In a conventional Fabry Perot diode semiconductor laser, a resonant cavity is formed extending longitudinally in the plane of the semiconductor substrate with reflective structures at opposite ends. In contrast, in a VCSEL, the resonant cavity is arranged vertically in the substrate with the advantage that light is transmitted perpendicularly from its surface over a larger area than with a horizontal structure, which renders the VCSEL well suited to launching signals into optical telecommunications fibres. An example of a VCSEL is given in IEEE Photonics Technology Letters Vol. 7 No. 6 June 1995 pp 608–610, M. A. Fisher et al. The device consists of a semiconductor substrate on which are formed first and second reflective means that comprise periodic Bragg reflective structures, with a resonant cavity between them that includes a layer of laser active material with spacer layers to provide a sufficient cavity thickness to achieve resonance at a desired operating wavelength $\lambda$. The first reflective means may comprise a plurality of interleaved layers of different semiconductor materials with different refractive indices of $\lambda/4$ effective thickness, overlying the substrate. The Bragg structure of the second reflective means overlies the cavity and is formed of layers of dielectric material, with different refractive indices, of $\lambda/4$ effective thickness.

In order to pass current through the laser active material in the cavity, a metal contact is formed on the underside of the substrate and a conductive contact layer is formed between the dielectric second reflective means and the layers in the resonant cavity. Current is confined to the cavity by a peripheral reverse-biassed junction.

The thickness of the resonant cavity is typically of the order of 1 $\mu$m, whereas in a plane perpendicular to the thickness, the cavity has a relatively large transverse dimension; the cavity is typically square or circular when viewed from above with a diameter or side length of the order of 5~20 $\mu$m.

A problem that arises in conventional VCSEL structures is that during resonance of the cavity, the transverse mode of resonance is left largely uncontrolled and the relatively large diameter of the cavity may support a number of different transverse modes, which leads to mode competition and instability.

Use of a surface grating of concentric circular elements in a conventional distributed feedback (DFB) or distributed Bragg reflector (DBR) laser, with a horizontal, rather than vertical resonant cavity is disclosed in "Circularly is Symmetric Operation of a Concentric-Circle-Grating, Surface-Emitting, AlGaAs/GaAs Quantum-Well Semiconductor Laser", T. Erdogan et al, Appl. Phys. lett. 60 (16) Apr. 20, 1992 pp 1921–23. With this device, a conventional transversely extending resonant cavity is provided with a surface grating which produces surface emission from the laser by second order Bragg reflection. The circular pattern of the grating results in the emission of a circularly symmetric beam.

Another device is described in U.S. Pat. No. 5,301,201 and "Zone Laser" Appl. Phys. Lett. 65 (2) Jul. 11, 1994 pp 144–146, D. Vakhshoori et al, in which the laser cavity is divided into a plurality of concentric zones which each support an individual resonant mode. The outputs of the concentric zones sum together in a similar way to light from the zones of a Fresnel lens, thereby focusing the laser output into a single spot.

In Applied Physics Letters, Vol 66, No. 21, May 22, 1995, pp 2769–2771, J. H. Ser et al, there is described a VCSEL which has an overlaid fine metal interlaced grating etched on its upper DBR, overlying its light emitting face. The purpose of the grating is to produce polarisation stabilisation, for example to select TM polarisation as the dominant polarisation mode.

SUMMARY OF THE INVENTION

The present invention offers an alternative approach. In accordance with the invention, there is provided an optically resonant structure comprising first and second reflective means spaced apart so as to provide an optically resonant cavity with a relatively small thickness dimension between the reflective means and extending over an area with relatively large transverse dimensions in a plane transverse to the thickness dimension, and means for reflecting a component of the optical radiation from the cavity travelling parallel to said plane, with a phase characteristic for supporting a preselected transverse resonant mode in the cavity.

The reflective means may comprise means for producing Bragg reflection of radiation from the cavity. The Bragg reflection may be produced by means of a pattern of material with a spatially periodic optical refractive index characteristic.

The structure according to the invention may be used in a laser, for example a VCSEL, so that a layer of laser active material for producing optical radiation may be provided between the first and second reflective means. The layer of laser active material may be spaced from the reflective means by at least one spacer layer.

The invention also includes an optically resonant structure comprising means for providing an optically resonant cavity, optically active material with a relatively small thickness dimension and extending over an area with relatively large transverse dimensions in a plane transverse to the thickness dimension, wherein means are disposed around the active material for reflecting a component of the optical radiation therein travelling in said plane with a phase characteristic for supporting a preselected transverse resonant mode in the cavity.

The means for producing Bragg reflection may comprise a pattern of rings formed in at least one of the layers of the structure. In the embodiment described hereinafter, the rings are formed in a blocking layer, which confines current flow through the cavity.

The rings may be of different widths in order to maximise support of the preselected resonant mode for the cavity. The rings may comprise grooves formed in the layer or alternatively ridges which are upstanding from the layer.

So-called Bragg waveguides have been proposed previously in which conventional waveguide cladding is replaced by a periodic multilayer structure with high reflectivity that results from interference between partial reflections at a number of the interfaces between the layers. Bragg waveguides, including antiresonant reflecting optical waveguides or ARROWs were proposed and first demonstrated in GaAs planar structures in 1977, see P. Yeh, A. Yariv, C-S Hong, J. Opt. Soc. Am. 67, 423 (1977) and A. Y. Cho, A. Yariv, P. Yeh, Appl. Phys. Lett. 30, 471 (1977). The idea was extended to a cylindrical geometry but the benefits in respect of a conventional cylindrical waveguide were found to be unrealisable in practice for optical fibres because the fabrication tolerances are unrealistic and the launching of light is inefficient, see N. J. Doran K. J. Blow, IEEE J. Light. Tech. LT-1, 108 (1983). It has however been found in accordance with the invention that a periodic Bragg reflector arrangement around the cavity of a VCSEL can support a preselected resonant mode in the cavity of the laser, without suffering from the previously discussed disadvantages which occur in respect of an optical fibre.

BRIEF DESCRIPTION OF THE DRAWINGS

In order that the invention may be more fully understood, an embodiment of a VCSEL with a cylindrical Bragg waveguide, will now be described by way of example with reference to the accompanying drawings, in which.

DETAILED DESCRIPTION

Figure 1:
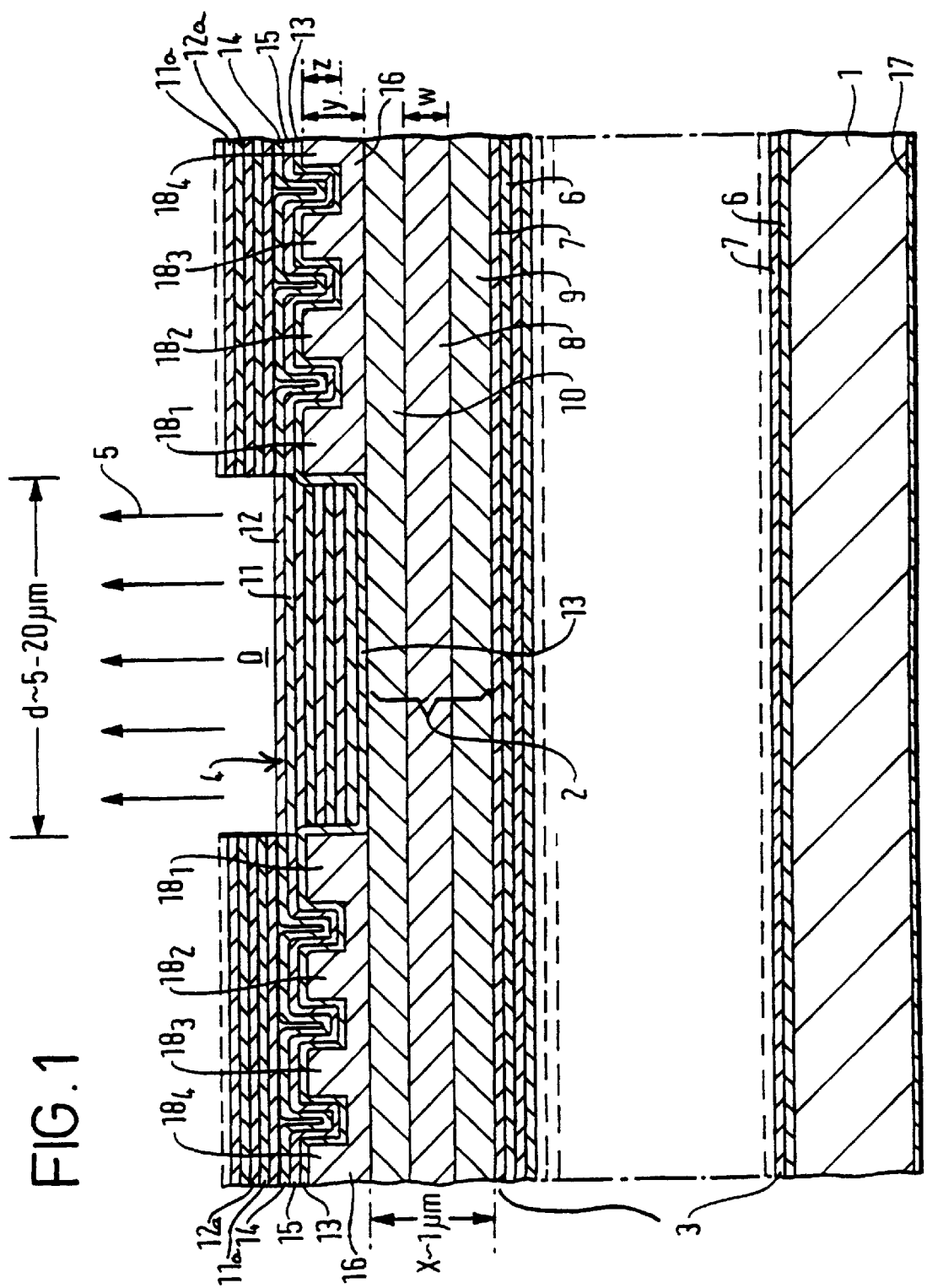
FIG. 1 is a schematic sectional view of a VCSEL with a circular Bragg structure surrounding its cavity according to a first embodiment of the invention.

The basic VCSEL structure shown in FIG. 1 is generally similar to that described by Fisher et al supra and comprises a semiconductor substrate 1 of InP material on which a resonant cavity 2 is formed, of thickness X between a first reflective means 3 and a second reflective means 4. The dimensions of the cavity are so arranged that in use, light of a predetermined wavelength $\lambda$ e.g. 1.55 $\mu$m is generated by laser action and emitted in the direction of arrows 5.

The first reflective means 3 is electrically conductive and comprises a plurality of interleaved layers of InGaAsP 6 of bandgap equivalent wavelength 1.4 microns, and InP 7 of $\lambda/4$ effective thickness that are deposited on the substrate as a stack with 45 periods, so to provide a 90 layer DBR structure. The layers 6, 7 are typically deposited by conventional gas source MBE techniques.

In the resonant cavity 2, an undoped InGaAsP laser active material layer 8 of bandgap equivalent wavelength of 1.55 microns of a thickness corresponding to one wavelength at 1.55 $\mu$m (i.e 0.45–0.47 $\mu$m) is overgrown onto the first reflective means 3 by atmospheric pressure metalorganic vapour phase epitaxy (MOVPE) between an n-doped layer of InP 9 which acts as a underlying spacer layer, and an overlying spacer layer 10 formed of p-doped InP material. The thicknesses of the spacer layers 9,10 are selected so that the cavity produces resonance at the desired operating wavelength of $\lambda$=1.55 $\mu$m (i.e. with the overall cavity dimension X being around 1 $\mu$m).

The second reflective means 4 comprises an interleaved stack of dielectric material consisting of layers 11 of $Al_2O_3$ material interleaved with layers 12 of Si material, the layers being deposited by conventional evaporation techniques. The layers 11, 12 have an effective wavelength thickness of $\lambda/4$ and are of different refractive indices so as to act as a DBR in a similar manner to the first reflective means 3, although the layers 11, 12 are electrically non-conducting.

In order to energise the laser, an electric current is passed through the resonant cavity 2, from an electrically conductive p-doped GaInAsP contact layer 13 of bandgap equivalent wavelength 1.4 microns on the underside of the dielectric reflector 4, the layer 13 being connected to a metal contact layer 14 formed by vapour deposition on an intermediate contact layer 15 formed of $p^+$ GaInAs material, deposited on the layer 13. An external electrical connection, not shown, is provided to the layers 13, 14. A current blocking layer 16 formed of n-doped InP material is deposited on the upper spacer layer 10 and, by conventional photolithography and etching, as for the structure described by Fisher et al supra, a central aperture D of diameter d, typically of the order of 5–20 $\mu$m, is formed, which defines the active region for the cavity. It can thus be seen that the cavity of the VCSEL has a relatively small vertical thickness dimension X between the first and second reflective means 3, 4 and a relatively large transverse dimension d in a horizontal plane, transverse to the thickness dimension. Likewise, the thickness dimension w of the active layer 8 is small in comparison with the transverse dimension The dimension w is typically of the range of 0.45–0.47 $\mu$m and the dimension X is in the region of 1 $\mu$m. This is in contrast to a conventional edge emitting laser which extends longitudinally in the plane of the substrate, for which a typical length is in the range of 300 to 500 $\mu$m, or greater. It will be seen that the electrical contact layer 13 forms direct electrical contact with the spacer layer 10 in the central aperture D so that current passes through the materials in the cavity, in this region. The current can pass through the semiconductor materials that form the first reflective means 3, and the substrate 1 so as to reach a Au metal contact 17 on the underside of the substrate. However, the blocking layer 16, produces a reverse p-n junction with the p-doped spacer layer 10 so as to confine current flow through the central aperture D. Thus, the current passes through the layer 8 in this active region to generate optical radiation which resonates in the cavity 2. It will be understood that due to the distributed nature of the multi-layer first and second reflective means 3, 4, the optical path length over which light resonates between them has an average length which is greater than the physical dimension X shown in FIG. 1.

Figure 2:
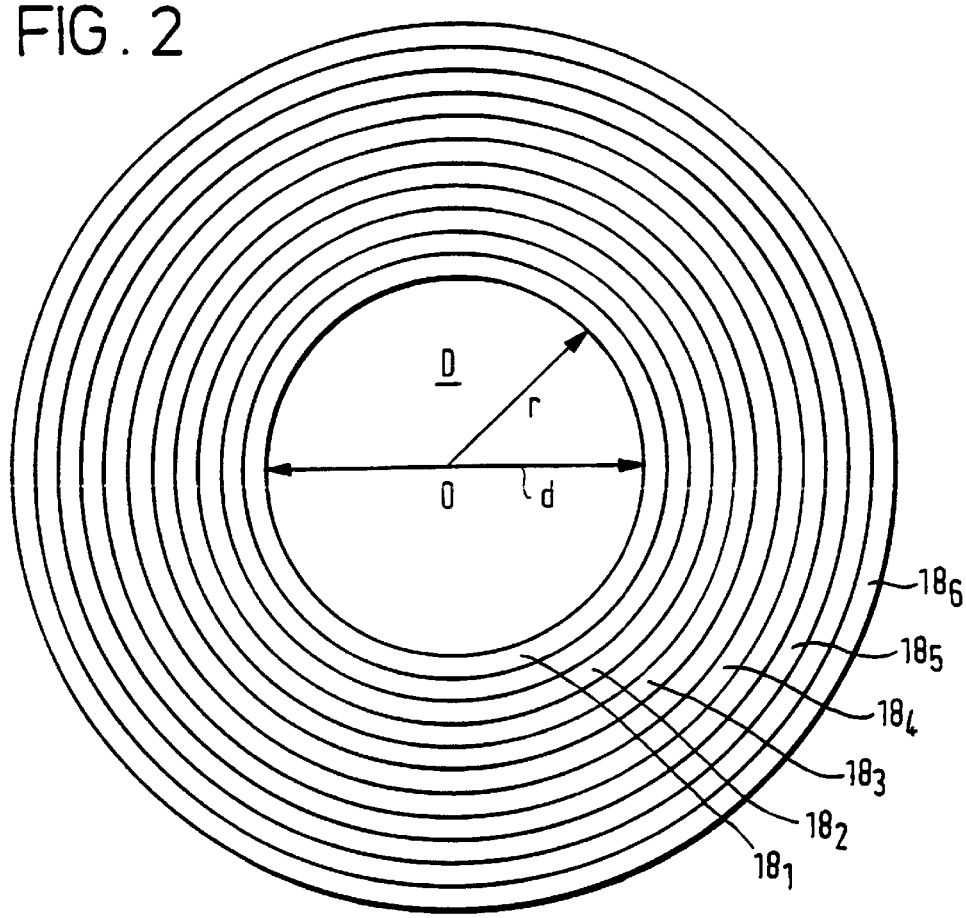
FIG. 2 is a top plan view of the cavity shown in FIG. 1.
Figure 3:
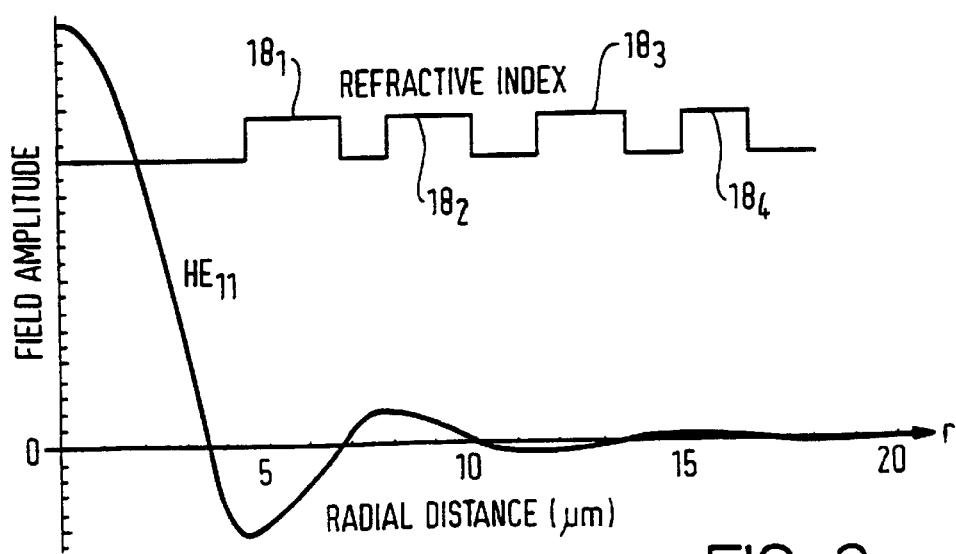
FIG. 3 is a graph illustrating the field amplitude as the function of radial distance from the centre of the cavity shown in FIG. 2, together with the spatial periodic refractive index variation of the Bragg structure in the radial direction.

In accordance with the invention, a series of circular rings 18 is formed in the uppermost surface of the blocking layer 16. As shown in FIG. 2, six rings $18_1$–$18_6$ or more may be preferred although, in FIG. 1, only four rings are shown for ease of illustration. As shown in the drawings, the central region D has a circular periphery and rings 18 are concentric with the circular central region. In the embodiment shown in FIG. 1, the rings are formed as upstanding ridges from the general planar extent of the blocking layer 16. This is achieved during manufacture, prior to the deposition of the layers 11 to 15, by electron beam lithography and selective etching of the blocking layer 16. Initially, the layer 16 is laid down with a continuous thickness y and is subsequently etched selectively by an amount z so as to define the ridges 18. In an alternative embodiment (not shown), grooves can be etched into the blocking layer. The electrical contact layers 13, 14 and 15 fill the spaces between the rings 18 when subsequently deposited on the layer 16. The n-doped InP material of the layer 16 has a different optical refractive index from the materials that form the electrode layers 13, 14 and 15, so that the rings 18 form a reflective Bragg structure for light from the cavity 2 which, whilst travelling in the direction of arrows 5 has a component in a plane parallel to the plane of the optically active layer 8. The rings 18 and the intervening material of layers 13, 14, 15 produce a spatially periodic refractive index pattern which confines the component travelling parallel to the aforesaid plane to the centre of the circular region D. FIG. 3 shows the spatially periodic pattern is selected so that the phase of the reflected light constructively supports a preselected resonant mode for the resonant cavity 2. Typically, the mode comprises the $HE_{11}$ mode which has a field amplitude as a function of radial distance outwardly from the centre O of the central region D, as shown in FIG. 3. The field amplitude has a substantially Gaussian peak at the centre O and decays towards the outer edge of the central region D. The spatially periodic refractive index pattern formed by the ridges $18_1$–$18_4$ is shown in FIG. 3 as a function of radial distance r, for a situation where the central region D has a diameter d of 9.2 μm (r=4.6 μm).

The radial width of the ridges 18 may change from ridge to ridge. Furthermore, the spacing between the ridges may differ. The specific ridge configuration is chosen to support the preselected resonant mode for the resonant cavity 2. In one example, the innermost ridge 18, was wider than the other ridges. The actual width may be computed according to the principles set out by Doran et al, supra.

Alternating layers 11a of $Al_2O_3$ and 12a of Si are formed over the rings 18. The alternating layers 11a, 12a form a DBR for reflecting the optical field that occurs outside the central region D.

Without the provision of the ridges 18, the $HE_{11}$ mode has to compete with other modes and thus tends to be unstable, but the provision of the Bragg structure provided by the rings 18 permits stabilisation of the preselected transverse mode.

Figure 4:
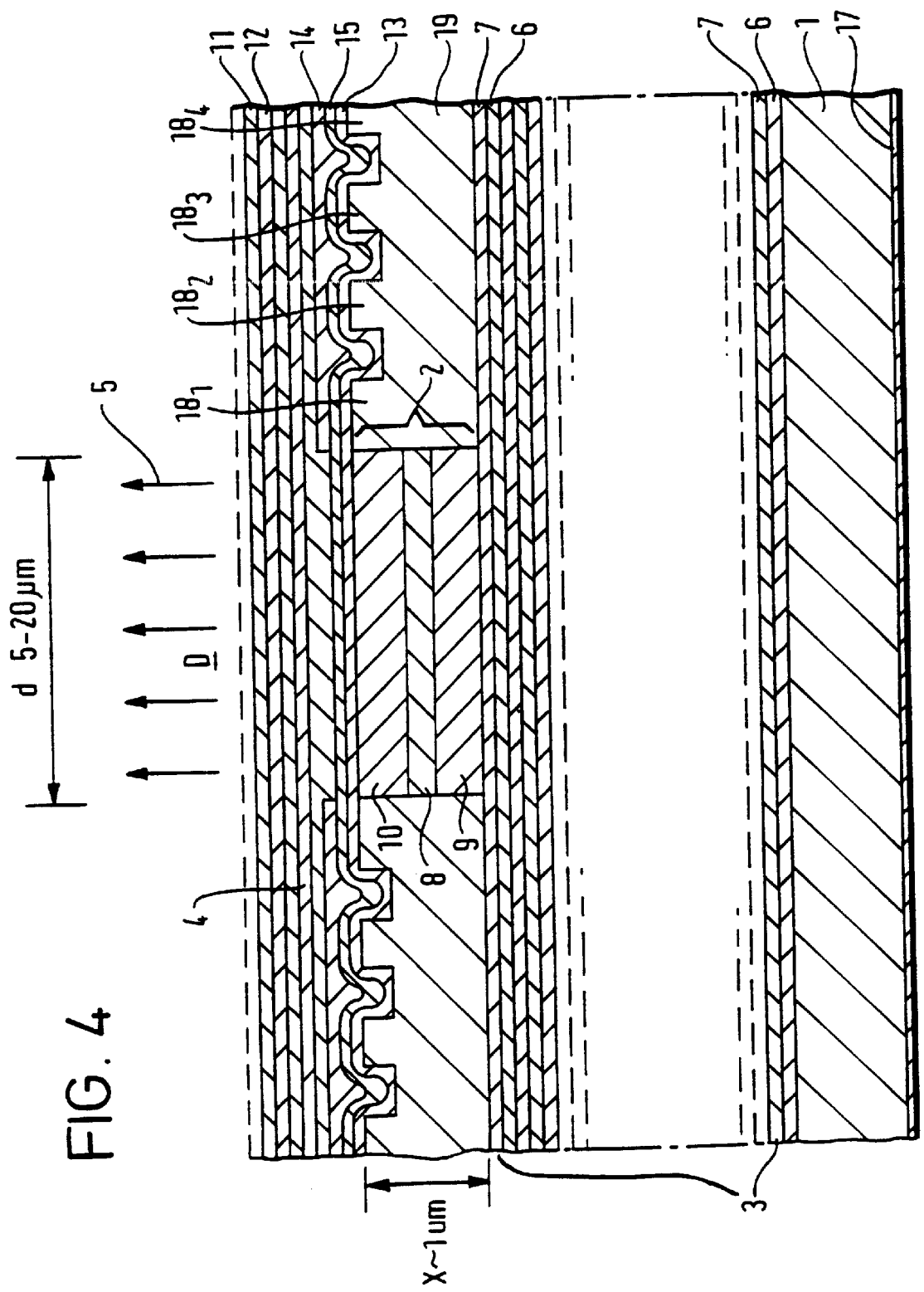
FIG. 4 is a sectional view corresponding to FIG. 1, of a second embodiment of a device according to the invention.

Another configuration of the structure is shown in FIG. 4, and can be considered as a modification of the device structure shown in FIG. 1. Like parts are marked with the same reference numbers. In the embodiment of FIG. 4, the blocking layer comprises a layer 19 of semi-insulating InP which is selectively re-grown around the cavity.

In order to form the structure, the active and spacer layers 8, 9, 10 are formed on the first reflective stack 3 as described with reference to FIG. 1, and then a mesa of diameter d, corresponding to the previously described area D for light emission, is formed from layers 8, 9, 10, by conventional lithography and etching. A planar, semi-insulating layer 19 of InP is then re-grown all around the mesa. A suitable technique for the re-growth that uses $PCl_3$ has been described in a paper by M. J. Harlow, P. C. Spurdens and R. H. Moss: "The influence of $PCl_3$ on the planarisation and selectivity of InP re-growth by atmospheric pressure MOVPE", Proceedings of the 7th International Convention on Indium Phosphide and Related Materials, May 9–13, 1995, Sapporo, Japan. The semi-insulating InP layer 19 was iron doped to provide electron traps in the layer, but it will be appreciated that other suitable dopants could be used. The regrown layer 19 has the advantage of providing a flat surface that is contiguous with the upper surface of the spacer layer 10, that can receive the various layers of the reflector structure 4, so that the step in the reflector shown in FIG. 1 around the edge of the region D, is avoided in the structure of FIG. 2. Reference is also directed to "Very Rapid and Selective Epitaxy of InP around Mesas of height up to 14 μm by Hydride Vapour Phase Epitaxy" S. Lourdudoss et al Conference Paper IPRM '94.

The confining Bragg structure 18 is then etched in the top of the layer 19 in the manner described previously with reference to FIG. 1. The contacting layers 13, 15 are then formed over the entire top surface, whereas the metallic contact layer 14 is formed only on the surface that lies outside of the area D where light is emitted. The second reflective means 4 is then formed over the top surface, as previously described, and a suitable electrical connection is made to the layer 14, not shown, in order to provide an external connection, e.g. by localised etching and metallisation or other conventional techniques.

Modifications and variations of the described structures are possible. For example, the spaces between the ridges 18 need not necessarily be filled with material and could be left empty. Alternatively, the spaces between the ridges could be filled with a different material, for example polyimide material. Also, the ridges 18 could be made in other layers of the structure, for example, in either of the underlying spacer layers 9, 10.

Furthermore, the invention is not necessarily restricted to lasers and it will be appreciated that the cavity 2 could be used as a passive cavity, without the need for electrical contacts, for example, to be used as an all optical switch or bistable element. Passive cavities are well known per se in the literature of microresonators, and have application in all-optical switching, logic, bistability, etc, see for example the paper "GaAs—AlAs Monolithic Microresonator Arrays" J. L. Jewel, A Scherer, S. L. McCall, A. C. Gossard & J. H. English, Appl Phys Lett, Vol 51, No 2, pp 94–96 (1987). The transverse mode confinement produced by the present invention represents an advance over the use of pillar structures as described in this reference, in terms of ruggedness.

In another modification, the rings 18 and the central region D are made elliptical in order to impart a predetermined polarisation to the emitted light for example with an ellipticity of 10–30%.

The invention is also applicable to a VCSEL in which the reflective layers 11, 30 12 are replaced by an anti-reflection stack, and the second reflective means comprises a mirror external to the semiconductor substrate, and reference is directed to "A C.W. external cavity surface emitting laser" by J. V. Sandusky A. Mukherjee and S. R. Brueck paper TuE11 at the Conference on Semiconductor lasers: Advanced Devices and Applications (Keystone, Colo., Aug. 21–23, 1995)—Optical Society of America 1995 Technical Digest Series, Volume 20, pp 153–155.

What is claimed is:

1. An optically resonant structure comprising:

first and second reflective means spaced apart so as to provide an optically resonant cavity with a relatively small thickness dimension between the reflective means and extending over an area with relatively large transverse dimensions in a plane transverse to the thickness dimension, and reflective means for reflecting a component of optical radiation from the cavity travelling parallel to said plane, with a phase characteristic for supporting a preselected transverse resonant mode in the cavity.

2. A structure as in claim 1 wherein the reflective means comprises means disposed around the cavity for producing Bragg reflection of radiation from the cavity.

3. A structure as in claim 2 wherein the means for producing Bragg reflection comprises a pattern of material with a spatially periodic optical refractive index characteristic.

4. A structure as in claim 2 including a layer of laser active material for producing optical radiation that is reflected in said preselected resonant mode between the first and second reflective means, for laser operation.

5. A structure as in claim 4 wherein the layer of laser active material is disposed between the first and second reflective means.

6. A structure as in claim 5 including a spacer layer between the layer of laser active material and the first or the second reflective means.

7. A structure as in claim 4 wherein at least one of the reflective means comprises a multiple layer configuration.

8. A structure according to claim 2 wherein the means for producing Bragg reflection comprises a pattern of rings.

9. A structure as in claim 8 wherein the rings comprise grooves.

10. A structure as in claim 8 wherein the rings comprise upstanding ridges.

11. A structure as in claim 8 wherein the rings are circular and concentric.

12. A structure as in claim 8 wherein the rings are generally parallel and disposed elliptically around the cavity.

13. A structure as in claim 8 wherein the rings are of different widths.

14. A structure as in claim 8 wherein spaces between the rings are filled with material of a refractive index different from that of the material of the layer in which the rings are formed.

15. A structure as in claim 8 wherein the rings have been formed by lithography and etching.

16. A structure as in claim 8 including a current blocking layer for confining current to the cavity, the pattern of rings being formed in the blocking layer.

17. A structure as in claim 16 wherein the blocking layer has been selectively etched to bound the perimeter of the cavity.

18. A structure as in claim 16 wherein the blocking layer has been selectively grown to bound the perimeter of the cavity.

19. A structure as in claim 18 wherein the blocking layer is formed of InP material.

20. A structure as in claim 8 wherein:

the first reflective means comprises a plurality of interleaved layers of semiconductor materials having different refractive indices, on a semiconductor substrate, the second reflective means comprises a plurality of interleaved layers of dielectric materials having different refractive indices, and the cavity includes an undoped semiconductor laser active material sandwiched between spacer layers of semiconductor material of opposite conductivity type.

21. A VCSEL including a Bragg structure around its cavity for supporting a predetermined transverse transmission mode.

22. An optically resonant structure comprising:

means for providing an optically resonant cavity, optically active material with a relatively small thickness dimension and extending over an area with relatively large transverse dimensions in a plane transverse to the thickness dimension, and means around the active material for reflecting a component of the optical radiation therein travelling in said plane with a phase characteristic for supporting a preselected transverse resonant mode in the cavity.

23. A structure as in claim 22 including a substrate with said optically active material formed as a layer thereon, and said means for defining the cavity includes first reflective means formed on the substrate, for cooperating with second reflective means external to the substance.

* * * * *